(12) United States Patent
Cooper

(10) Patent No.: US 6,917,228 B2
(45) Date of Patent: Jul. 12, 2005

(54) DELAY LOCKED LOOP CIRCUIT WITH TIME DELAY QUANTIFIER AND CONTROL

(75) Inventor: Chris Cooper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/164,735

(22) Filed: Jun. 6, 2002

(65) Prior Publication Data

US 2003/0227308 A1 Dec. 11, 2003

(51) Int. Cl.$^7$ ................................................ H03L 7/06
(52) U.S. Cl. ................. 327/158; 327/159; 331/DIG. 2; 375/376
(58) Field of Search ................................. 327/146, 147, 327/149, 150, 153–155, 156, 158, 161, 221, 270, 277; 331/1 A, DIG. 2; 375/373–376

(56) References Cited

U.S. PATENT DOCUMENTS

| | | | |
|---|---|---|---|
| 5,452,324 A | * | 9/1995 | Lewis et al. ................. 375/373 |
| 5,537,069 A | * | 7/1996 | Volk ............................ 327/149 |
| 5,920,518 A | | 7/1999 | Harrison et al. ............. 365/233 |
| 6,137,334 A | | 10/2000 | Miller, Jr. et al. ........... 327/271 |
| 6,150,856 A | | 11/2000 | Morzano ...................... 327/149 |
| 6,281,728 B1 | * | 8/2001 | Sung ............................ 327/158 |
| 6,337,590 B1 | * | 1/2002 | Millar .......................... 327/158 |
| 6,388,480 B1 | | 5/2002 | Stubbs et al. ................ 327/156 |
| 6,392,458 B1 | | 5/2002 | Miller et al. ................. 327/158 |
| 6,396,322 B1 | * | 5/2002 | Kim et al. .................... 327/158 |
| 6,446,180 B2 | | 9/2002 | Li et al. ....................... 711/167 |
| 6,452,431 B1 | | 9/2002 | Waldrop ....................... 327/158 |
| 6,493,829 B1 | * | 12/2002 | Kubo ........................... 713/500 |
| 6,556,489 B2 | | 4/2003 | Gomm et al. ................ 365/194 |
| 6,636,093 B1 | | 10/2003 | Stubbs et al. ................ 327/161 |
| 6,680,874 B1 | | 1/2004 | Harrison ...................... 365/233 |

* cited by examiner

*Primary Examiner*—Minh Nguyen
(74) *Attorney, Agent, or Firm*—Schwegman, Lundberg, Woessner & Kluth, P.A.

(57) ABSTRACT

A delay locked loop circuit has a quantifier for obtaining a measured delay quantity based on a time delay between an external signal and an internal signal. Based on the measured delay quantity, a delay controller controls a correction delay quantity applied to a signal path of the external signal to synchronize the external and internal signals.

50 Claims, 11 Drawing Sheets

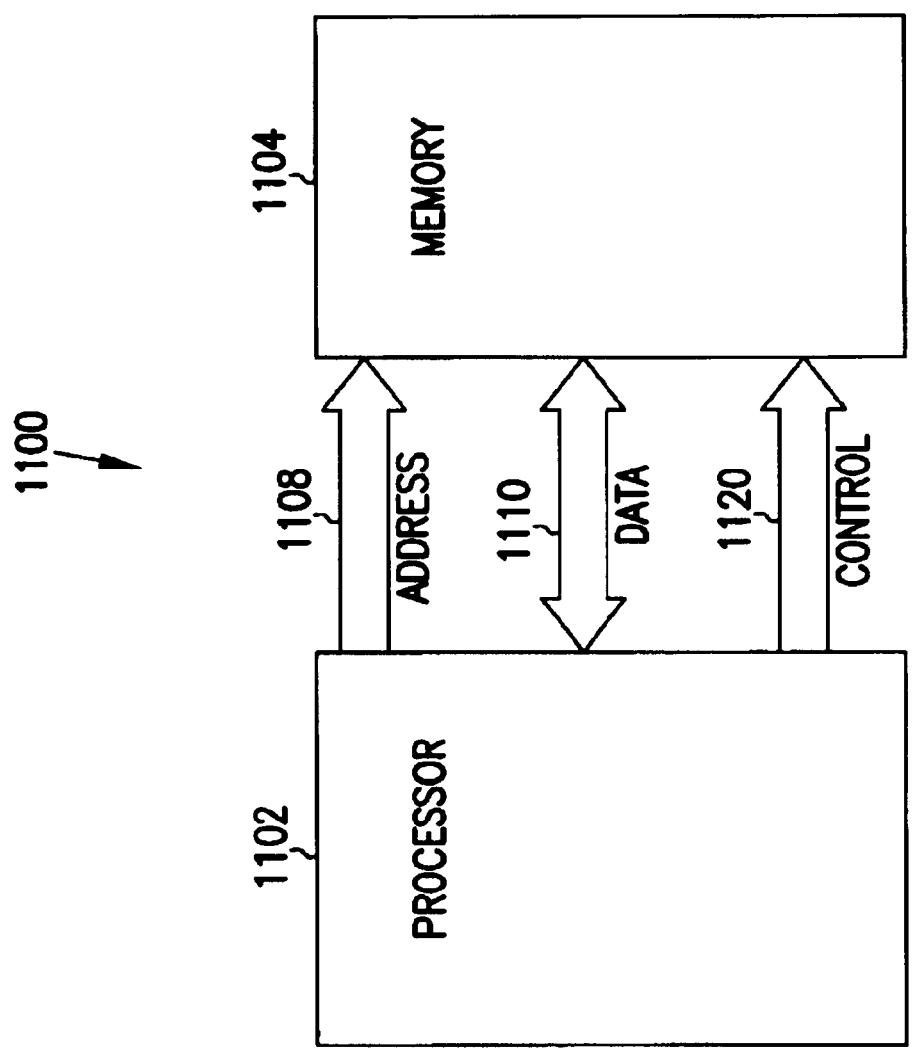

DELAY LOCKED LOOP CIRCUIT WITH TIME DELAY QUANTIFIER AND CONTROL

FIELD

The present invention relates generally to integrated circuits, and in particular to delay locked loops.

BACKGROUND

Delay locked loops (DLL) reside in many integrated circuits for delaying an external signal to obtain an internal signal synchronized with the external signal. The internal signal usually serves as a reference signal for the integrated circuits instead of the external signal because the internal signal matches internal operating conditions of the integrated circuits, such as process, voltage, and temperature, better than the external signal does.

A typical DLL uses a delay line to delay the external signal. In most cases, the external and internal signals are initially not synchronized. The DLL performs a synchronization process to synchronize the external and internal signals. In the process, the DLL compares the external and internal signals to detect for a time delay between them. After the comparison, the DLL adjusts the delay of the delay line by a preset amount of delay to correct the time delay. After the adjustment, the DLL compares the external and internal signals again then adjusts the delay with the preset amount to correct any subsequent time delay.

The typical DLL usually repeats the comparison and adjustment many times to gradually reduce the time delay until the external and internal signals become synchronized. Repeating the comparison and adjustment many times to synchronize the external and internal signals wastes time and power.

SUMMARY OF THE INVENTION

Various embodiments of the invention provide circuits and methods to operate a DLL more efficiently.

In one aspect, the DLL includes a pulse generator for generating a pulse with a pulse width corresponding to a time delay between an external signal and an internal signal. A quantifier quantifies the pulse width to obtain a measured delay quantity. A delay unit is capable of applying a correction delay quantity to a signal path of the external signal. A delay controller controls the correction delay quantity based on the measured delay quantity to synchronize the external and internal signals.

In another aspect, a method of processing signals includes applying an initial delay quantity to a signal path of an external signal to generate an internal signal. A pulse is generated. The width of the pulse corresponds to a time delay between the external and internal signals. The method also obtains a measured delay quantity based on the width of the pulse. The method further applies a correction delay to the signal path of the external signal based on the measured delay quantity to synchronize the external and internal signals.

BRIEF DESCRIPTION OF THE DRAWINGS

FIG. 11 shows a system according to an embodiment of the invention.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
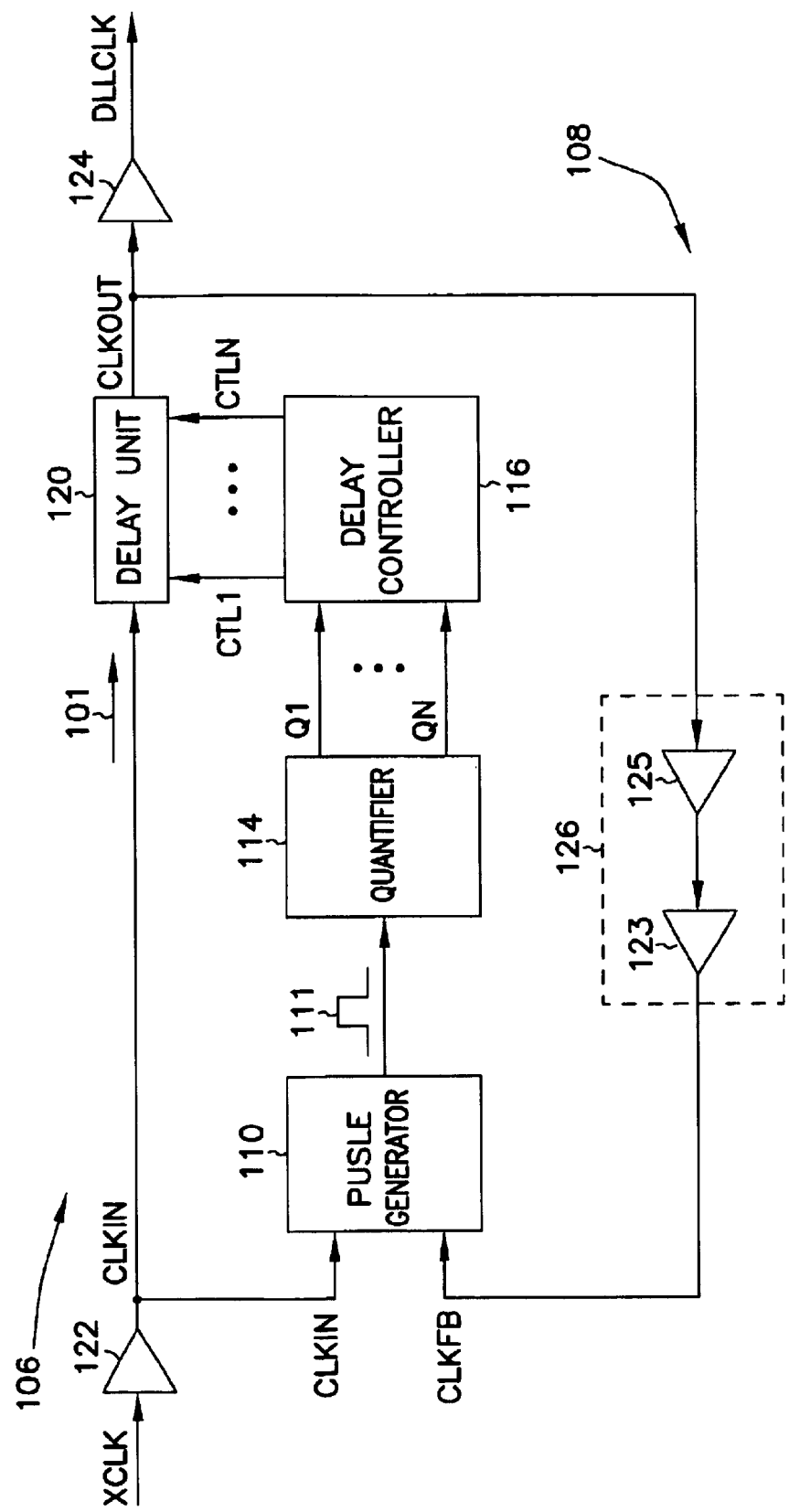
FIG. 1 shows a delay locked loop circuit according to an embodiment of the invention.

FIG. 1 shows a DLL according to an embodiment of the invention. DLL 100 includes a delay unit 120 for applying a correction delay quantity to a signal path 101 of an external signal XCLK to generate an internal signal DLLCLK. Initially, the correction delay quantity is zero. A pulse generator 110 generates pulse 111 based on a feedback version of the DLLCLK signal (CLKFB) and a delayed version of the XCLK signal (CLKIN). The width of pulse 111 corresponds to the time delay between the XCLK and DLLCLK signals. A quantifier 114 obtains a measured delay quantity based on the width of pulse 111. A plurality of quantifying signals Q1–QN indicates the measured delay quantity. After the measured delay quantity is obtained, a delay controller 116 activates one of the delay control signals CTL1–CTLN to change the correction delay quantity of delay unit 120 from the zero to a quantity equal to the measured delay quantity to synchronize the XCLK and DLLCLK signals.

Delay unit 120, an input buffer 122, and an output buffer 124 form a forward path 106. Input buffer 122 receives the XCLK signal and outputs the CLKIN signal. Output buffer 124 receives an output signal CLKOUT from delay unit 120 and outputs the DLLCLK signal.

A delay model 126 is located on a feedback path 108 for delaying the CLKOUT signal to provide the CLKFB signal. Delay model 126 has a time delay equal to the sum of a time delay of input buffer 122 and a time delay of output buffer 124. Delay model 126 includes an input buffer model 123 and output model buffer 125. In some embodiments, input buffer model 123 is identical to input buffer 122 and output buffer model 125 is identical to output buffer 124. Delay model 126 allows a time delay between the CLKIN and CLKFB signals to be equal to a time delay between when the XCLK and DLLCLK signals. Therefore, generating a pulse 111 based on a time delay between the CLKIN and CLKFB signals is equivalent to generating a pulse based on a time delay between the XCLK and DLLCLK signals.

Figure 2:
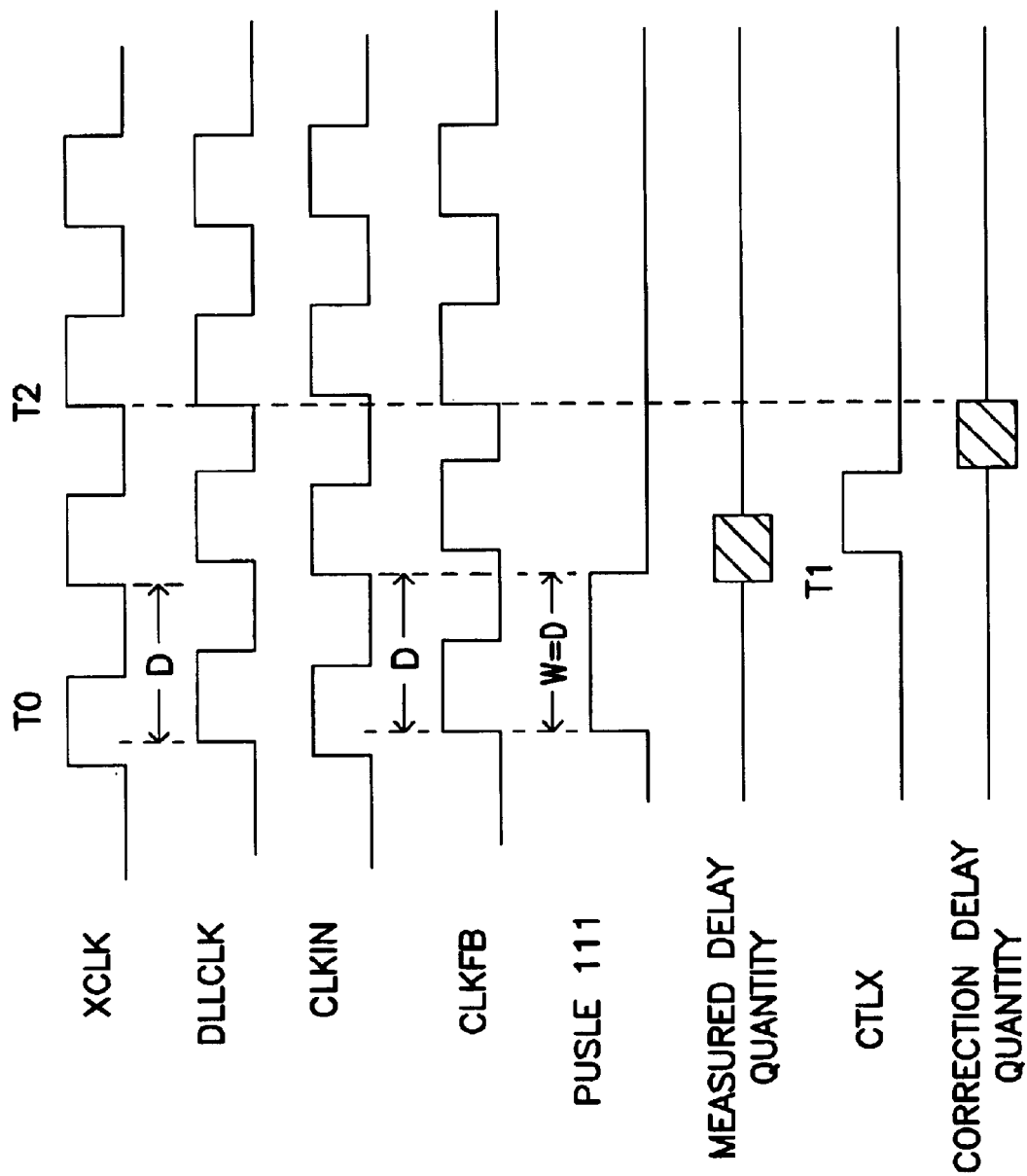
FIG. 2 shows an example of a timing diagram for FIG. 1.

FIG. 2 shows an example of a timing diagram for FIG. 1. Between times T0 and T2, the XCLK and DLLCLK signals are not synchronized, and a delay D indicates a time delay between them. The CLKIN and CLKFB signals also have a time delay equal to time delay D. Pulse generator 110 generates pulse 111 with a width W corresponding to the time delay D. At time T1, delay controller 116 activates a delay control signal CTLX based on the width of pulse 111. The CTLX signal represents one of the CTL1–CTLN signals that corresponds to the measured delay quantity that is needed to correct the time delay D. Between times T1 and T2, delay unit 120 applies a correction delay quantity indicated by the CTLX signal to correct the time delay D. After the correction, the XCLK and the DLLCLK signal are synchronized at time T2.

Figure 3:
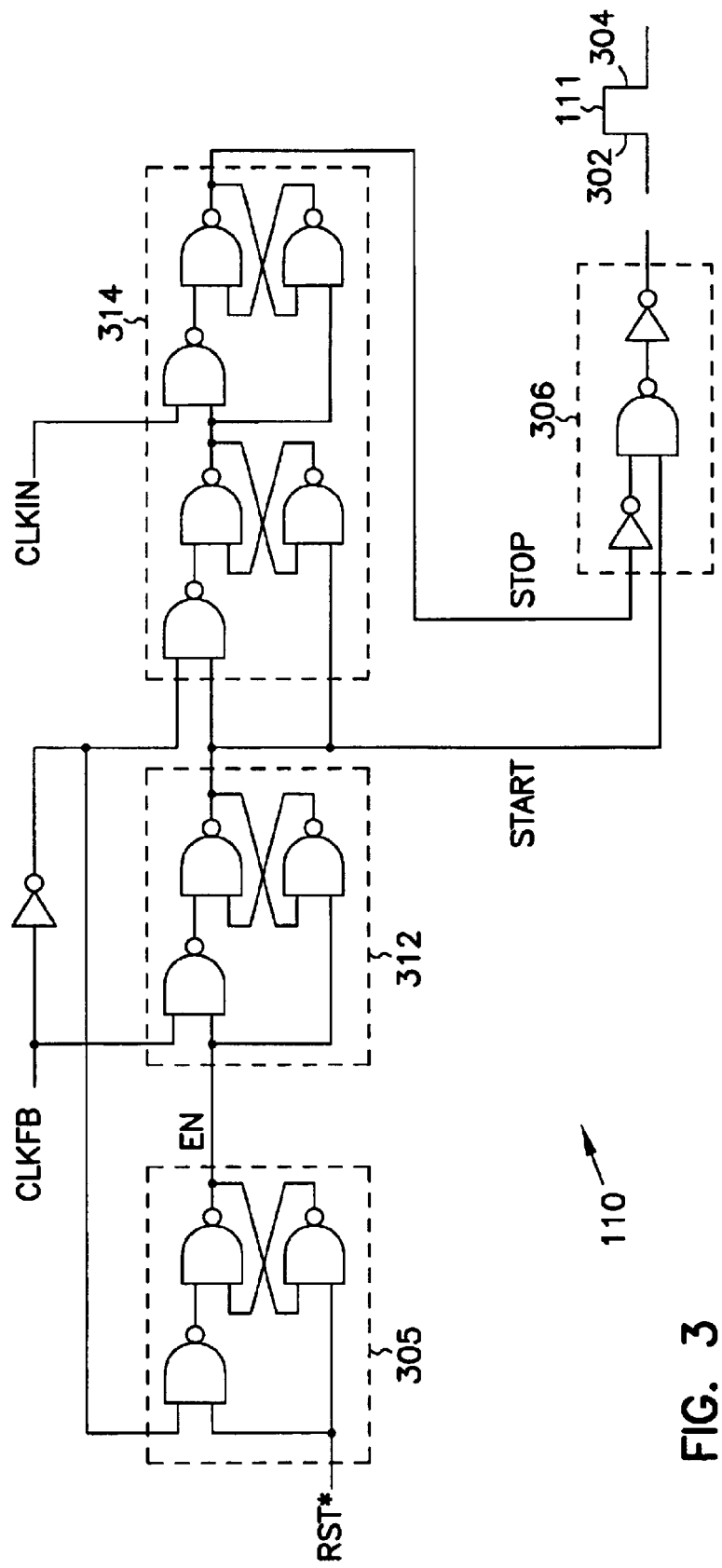
FIG. 3 shows an embodiment of a pulse generator of FIG. 1.

FIG. 3 shows an embodiment of pulse generator 110 of FIG. 1. Pulse generator 110 generates pulse 111 having a first edge 302 and a second edge 304. A first edge creator 312 has a first set of flip flop for producing edge 302 based on the CLKFB signal. A second edge creator 314 has a second set of flip flops for producing edge 304 based on the CLKIN signal. An output unit 306 connects to edge creators 312 and 314 to output pulse 111 based on a start signal START and a stop signal STOP. Pulse generator 110 has a reset unit 305 for activating an enable signal EN to start a new pulse based on a reset signal RST*.

Figure 4:
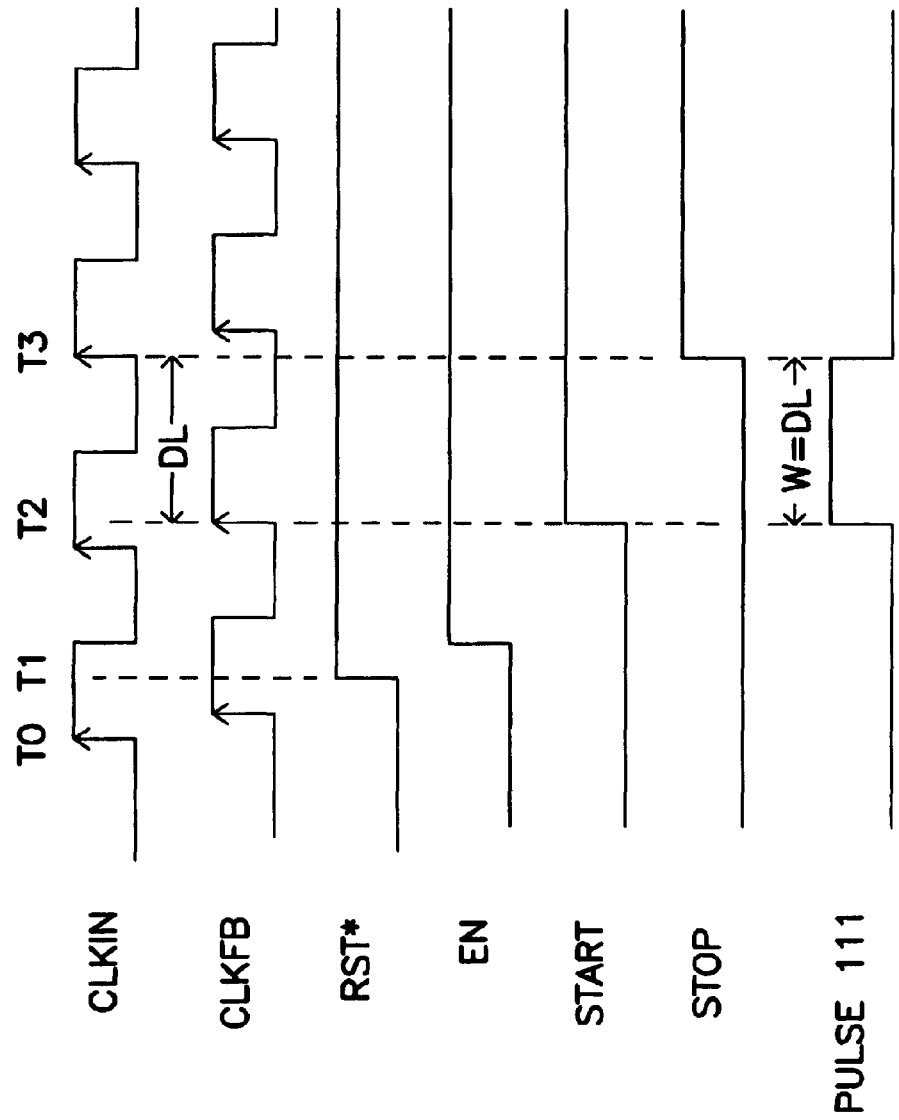
FIG. 4 is a timing diagram for the pulse generator of FIG. 3.

FIG. 4 is a timing diagram for the pulse generator of FIG. 3. DL indicates the time delay between the rising edge of the CLKFB signal and the rising edge of the CLKIN signal. Before time T0, the RST* signal is LOW, forcing the EN signal LOW. The START and STOP signals remain LOW or inactivated when the EN signal is LOW. When both of the START and STOP signals are LOW, pulse 111 remains LOW and has no edges.

At time T1, the RST* signal goes HIGH. The EN signal switches HIGH when the CLKFB signal goes LOW at time T1. When the EN signal is HIGH, edge creator 312 activates the START signal at the rising of the CLKFB signal at time T2, creating first edge 302 of pulse 111. Pulse 111 remains HIGH between times T2 and T3, corresponding to a duration between the rising edges of the CLKFB and CLKIN signals. This duration is the time delay DL. The width W of pulse 111 corresponds to DL.

At time T3, edge creator 314 activates the STOP signal, creating second edge 304 of pulse 111. After time T3, both of the START and STOP signals are HIGH. Pulse 111 remain LOW and has no edges as long as the START and STOP signals remain HIGH. Pulse generator 110 generates another pulse when the RST* signal goes LOW and then goes back HIGH.

Figure 5:
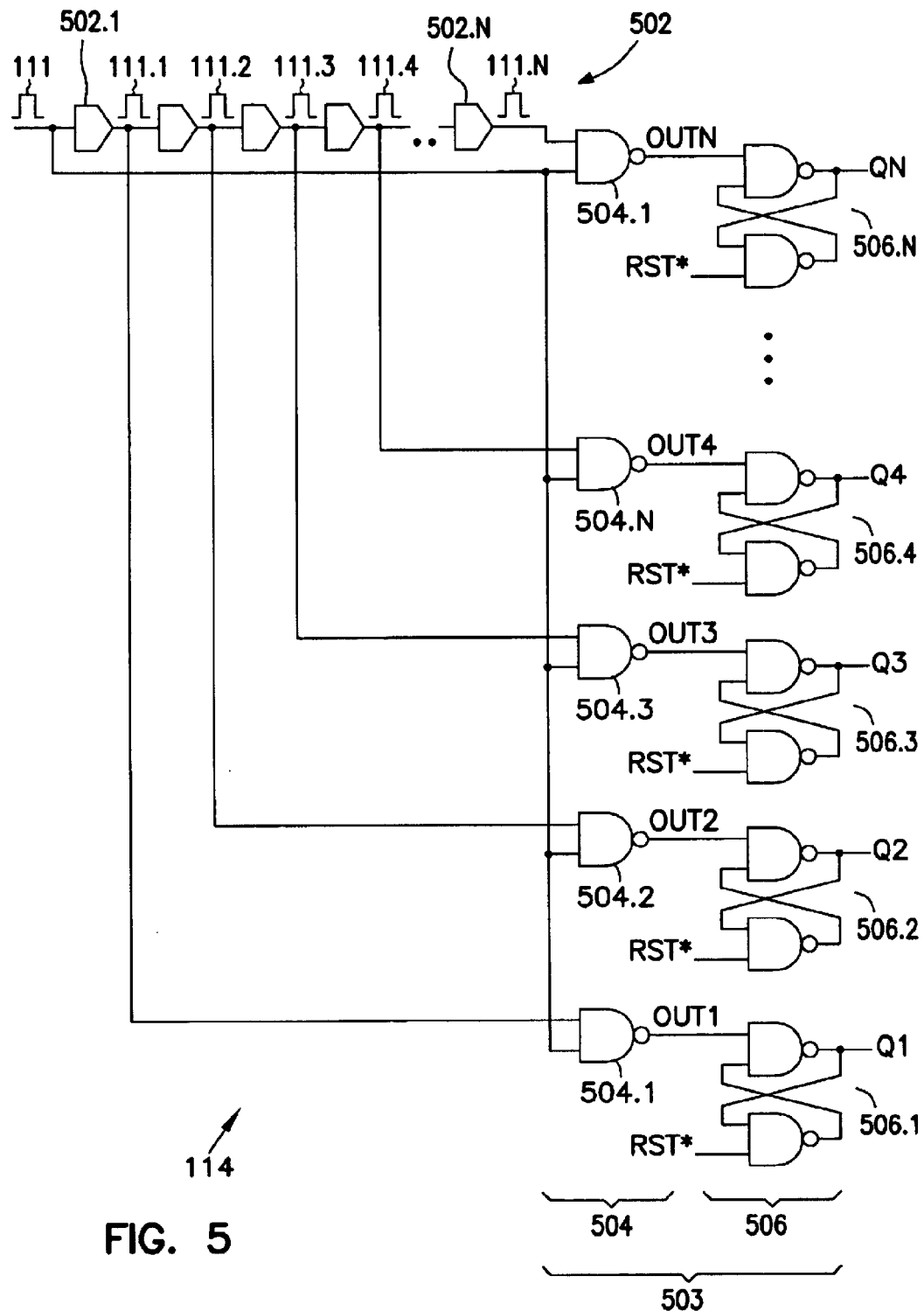
FIG. 5 shows an embodiment of a quantifier of FIG. 1.

FIG. 5 shows an embodiment of quantifier 114 of FIG. 1. Quantifier 114 has a quantifying delay line 502 and a quantifying logic unit 503. Quantifying delay line 502 propagates pulse 111 through a plurality of measuring delay elements 502.1–502.N to get a plurality of delayed pulses 111.1–111.N. Each of the measuring delay elements 502.1–502.N has a time delay. The number of the measuring delay elements corresponding to the width of pulse 111 equals the duration of the width divided by the time delay of each measuring delay element. For example, if the duration of the width is six time units and the time delay of each measuring delay element is two time units, then the number of the measuring delay elements corresponding to the width of the pulse is three (six divided by two).

Quantifying logic unit 503 has a quantifying logic portion 504 and a storing portion 506. Quantifying logic portion 504 has a plurality of quantifying logic gates 504.1–504.N for comparing pulse 111 with each of the delayed pulses 111.1–111.N to determine a number of the measuring delay elements corresponding to the width of pulse 111. Quantifying logic gates 504.1–504.N sequentially activate the Out1–OutN signals during the comparison between pulse 111 and delayed pulses 111.1–111.N. Storing portion 506 includes a plurality of storing devices 506.1–506.N for storing the activation of the Out1–OutN signals in forms of the signal levels of the quantifying signals Q1–QN. Each of the quantifying signals Q1–QN corresponds to a different number of measuring delay elements. But only one of the Q1–QN signals indicates a number of the measuring delay elements that corresponds to the width of pulse 111. For example, if the width of the pulse corresponds to three measuring delay elements, quantifier 114 activates the Q1, Q2, and Q3 signals. Q4 through QN are not activated. Among the activated Q1, Q2, and Q3 signals, Q3 signal indicates the number (three) of the measuring delay elements that corresponds to the width of pulse 111.

In some embodiments, a quantifying signal has a high signal level (HIGH) when it is activated and a low signal level (LOW) when it is not activated (inactivated). For example, the Q1, Q2, and Q3 signals have a high signal level when they are activated. The inactivated Q4 through QN have LOW signal levels. In this example, storing devices 506.1–506.3 store (or hold) the Q1–Q3 signals HIGH and storing devices 506.4–506.N hold the Q4–QN signals LOW. Storing devices 506.1–506.N reset all of the Q1–QN signals to the same signal level when the RST* signal changes its signal level. For example, storing devices 506.1–506.N reset all of the Q1–QN signals to LOW when the RST* signal changes to LOW. In embodiments represented by FIG. 5, each of the storing devices 506.1–506.N includes a flip flop.

Figure 6:
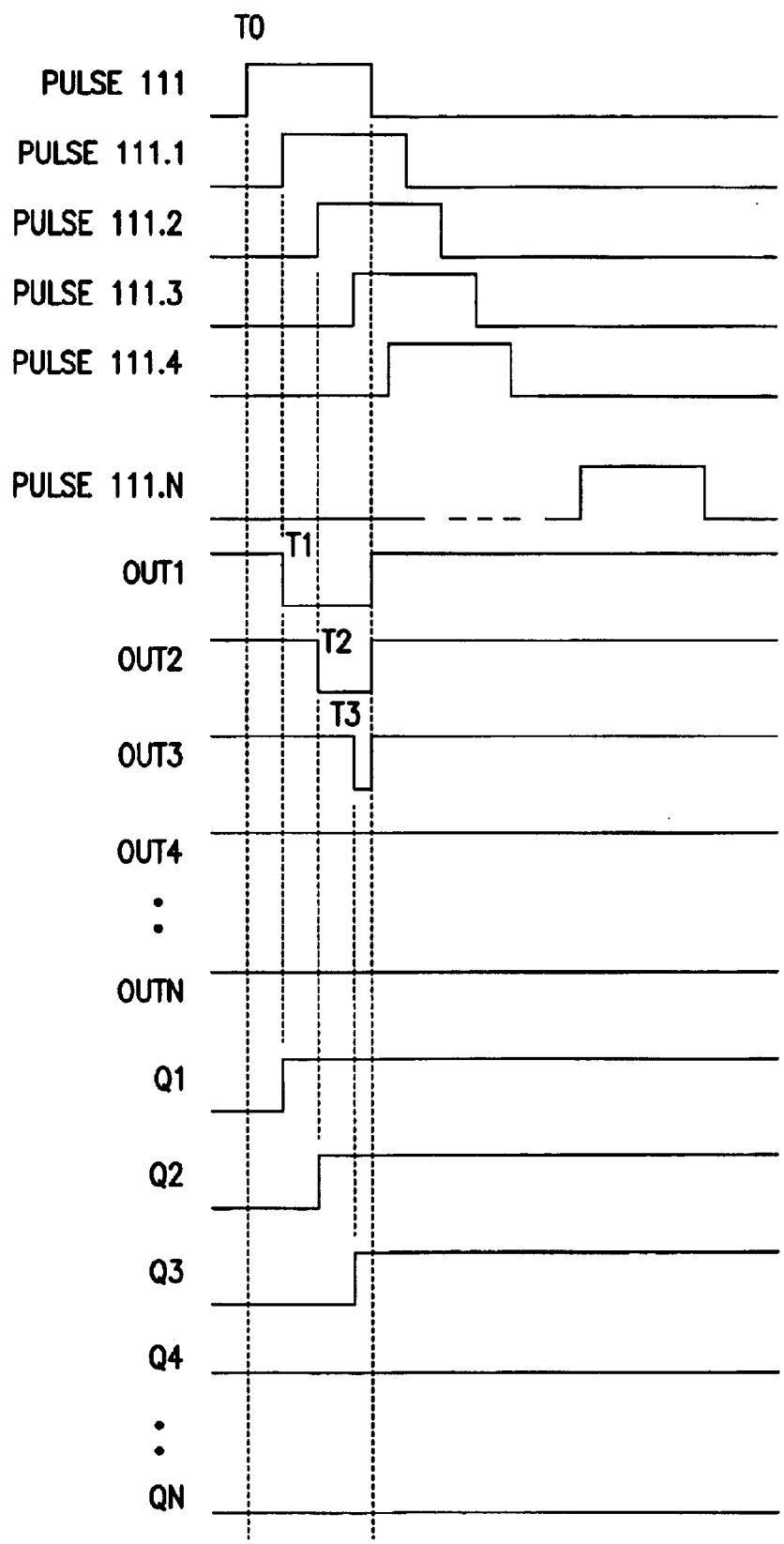
FIG. 6 is a timing diagram for the quantifier of FIG. 5.

FIG. 6 is a timing diagram for the quantifier of FIG. 5. Before time T0, pulse has not entered quantifying delay line 502. Therefore, the outputs of all measuring delay elements 502.1–502.N shows no pulses. The Out1–OutN signals are HIGH; the Q1–QN signals are LOW. At time T0, pulse 111 enters quantifying delay line 502 and all gates 504.1–504.N. Pulse 111 exits each measuring delay element at various times. For example, pulse 111 exits delay elements 502.1–502.4 as delayed pulses 111.1, 111.2, 111.3 and 111.4 at times T1, T2, T3, and T4, respectively. A certain number of the Out1–OutN signals sequentially switches LOW when pulse 111 intersects a certain number of the delayed pulses 111.1–111.N. For example, if the width of pulse 111 corresponds to three measuring delay elements, the Out1, Out2, and Out3 signals sequentially switch LOW when pulse 111 intersects the delayed pulses 111.1, 111.2, and 111.3. When one of the Out1–OutN signal switches LOW, a corresponding one of the Q1–QN signals is activated HIGH and remains HIGH. In the example where the width corresponds to three measuring delay elements, the Q1, Q2, and Q3 signals are activated HIGH. However, only the Q3 signal indicates the number (three) of measuring delay elements corresponding to the width. In this case, three measuring delay elements is the measured delay quantity.

Figure 7:
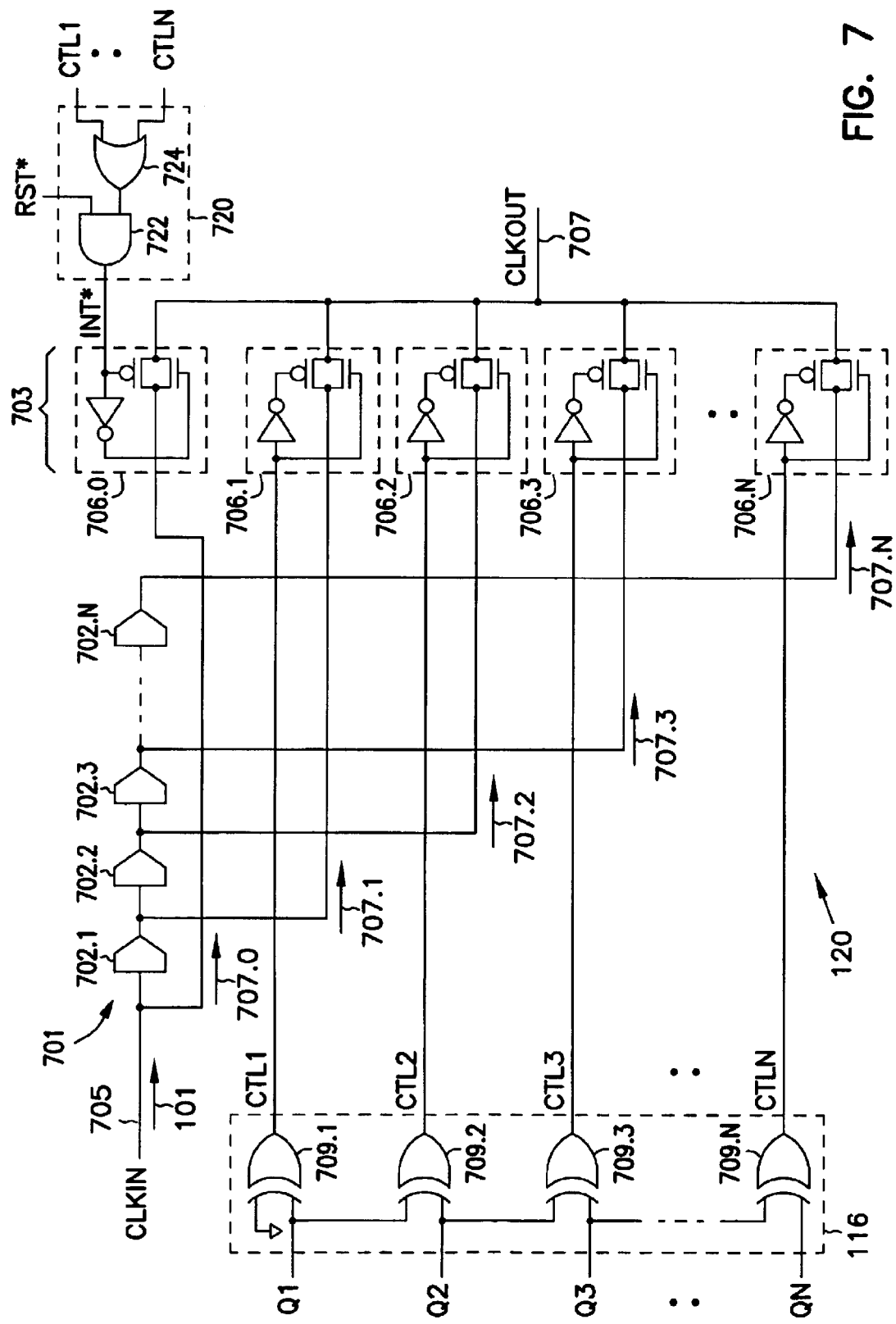
FIG. 7 shows an embodiment of a delay unit and an embodiment of a delay controller of FIG. 1.

FIG. 7 shows an embodiment of delay unit 120 and an embodiment of delay controller 116 of FIG. 1. Delay unit 120 includes a correction delay line 701 and a correction selector 703. Correction delay line 701 has a plurality of correction delay elements 702.1–702.N for applying a correction delay to the CLKIN signal. Since CLKIN signal is on signal path 101 of the XCLK signal (FIG. 1), applying a correction delay to the CLKIN signal is equivalent to applying a correction delay to signal path 101 of the XCLK signal. In FIG. 7, signal path 101 includes a path from node 705 to node 707.

In some embodiments, each of the correction delay elements 702.1–702.N and each of the measuring delay elements (FIG. 5) has equal time delay. Delay unit 702 applies a delay to signal path 101 using a number of correction delay elements that is equal to the number of measuring delay elements obtained by quantifier 114 (FIG. 5) to correct the delay between the XCLK and DLLCLK signals.

Correction selector 703 includes an initial delay selector 706.0 and a plurality of correction pass gates 706.1–706.N, each being located in one of a plurality correction paths 707.1–707.N. Each of the correction paths 707.0–707.N is one possible path for the CLKIN signal to propagate from node 705 to node 707 to become the CLKOUT signal. Each correction path has a different number of correction delay elements. For example, correction path 707.0 has no correction delay elements. Correction path 707.1 has one correction delay element 702.1. Correction path 707.2 has two correction delay elements 702.1 and 702.2. Path 701.N has N correction delay elements, 702.1 through 702.N. Since each correction path has a different number of correction delay elements, each correction path applies a different correction delay quantity to signal path 101.

Delay controller 116 has a control logic unit 709 for controlling the number of correction delay elements applied to signal path 101. Control logic unit 709 includes a plurality of control logic gates 709.1–709.N. The CTL1–CTLN signals at the outputs of gates 706.1–706.N controls correction pass gates 706.1–706.N. The combination of the CTL1–CTLN signals and the RST* signal control initial delay selector 706.0.

When none of the CTL1–CTLN signals is activated, all correction pass gates 706.1–706.N turn off, only initial delay selector 706.0 turns on and allows the CLKIN signal to propagate from node 705 to node 707 via path 707.0. Since correction path 707.0 has no correction delay elements, path 707.0 applies zero delay to signal path 101. When one of the CTL1–CTLN signals is activated, initial delay selector 706.0 turns off. The CLKIN signal propagates from node 705 to node 707 via one of the correction paths 707.1–707.N.

Control logic unit 709 activates one of CTL1–CTLN signals based on the measured delay quantity to turn on one of the correction pass gates 706.1–706.N to select which one of the correction paths 707.1–707.N for the CLKIN to propagate from node 705 to node 707. The selected correction path has a correction delay quantity equal to the measured delay quantity. For example, when the measured delay quantity is three measuring delay elements, delay control 116 activates the CTL3 signal, turning on correction pass gate 708.3. The CLKIN signal propagates from node 705 to node 707 through correction delay elements 702.1, 702.2 and 702.3. In this example, three correction delay elements, which is equal to the number of measured delay quantity, are applied to signal path 101 to correct the time delay between the XCLK and DLLCLK signal.

Delay unit 120 further includes an initial enable logic 720 for generating an enable signal INT* to control initial delay selector 706.0. The combination of the combination of the CTL1–CTLN signals and the RST* signal allow gates 722 and 724 to either activate or deactivate the INT* signal. When none of the CTL1–CTLN signals is activated, initial enable logic 720 activates the INT* signal to turn on initial delay selector 706.0, regardless of the RST* signal. When one of the CTL1–CTLN signals and the RST* signal are activated, initial enable logic 720 deactivates the INT* signal to turn off initial delay selector 706.0.

Figure 8:
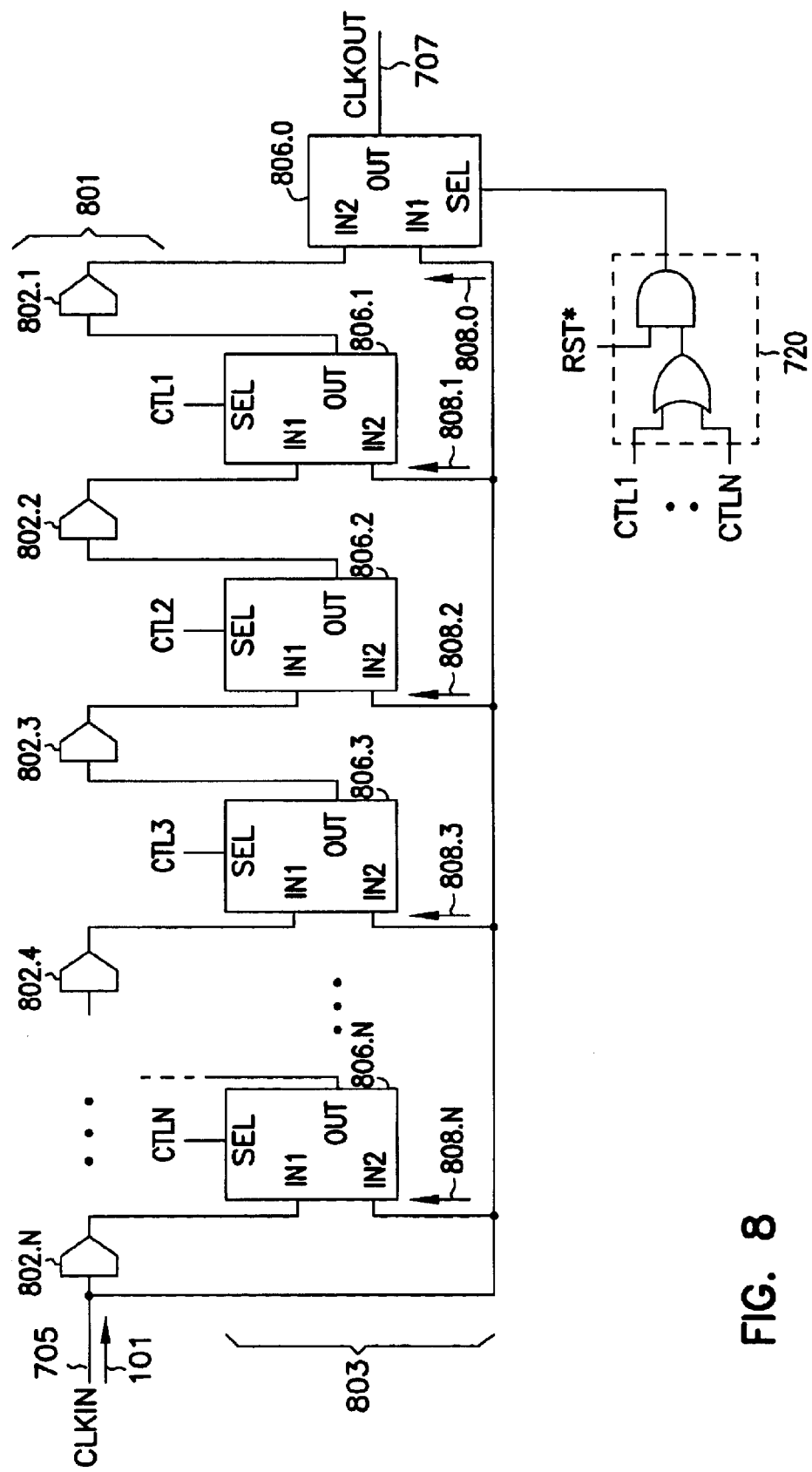
FIG. 8 shows another embodiment of a delay unit of FIG. 1.
Figure 9:
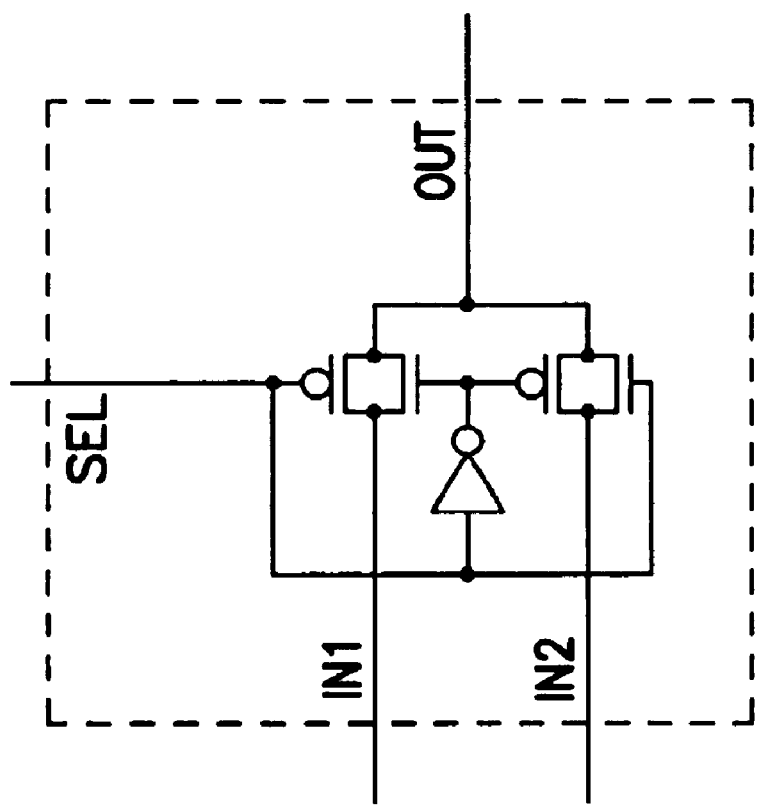
FIG. 9 shows an embodiment of a correction pass gate of FIG. 8.

FIG. 8 shows another embodiment of delay unit 120 of FIG. 1. Delay unit 120 includes a correction delay line 801 and a correction selector 803. Correction delay line 801 has a plurality of correction delay elements 802.1–802.N. Correction selector 803 includes an initial delay selector 806.0 and a plurality of correction pass gates 806.1–806.N. FIG. 9 shows an embodiment of each of correction pass gates 806.1–806.N of FIG. 8. In FIG. 9, each of the correction pass gates 806.1–806.N. allows either the signal at node IN1 or the signal at node IN2 to pass to node OUT based on one of the CTL1–CTLN signals on node SEL. For example, when the CTL2 signal is high, correction pass gates 806.2 allows the CLKIN signal to enter node IN2 and pass to node OUT and to correction delay element 802.1. When the CTL2 signal is low, correction pass gates 806.2 allows the signal from correction delay element 802.3 to enter to node IN1 and pass to node OUT to correction delay element 802.1.

A plurality of correction paths 808.0–808.N applies a different correction delay quantity to signal path 101. When none of the CTL1–CTLN signals is activated, initial delay selector 806.0 allows the CLKIN signal to pass from node IN1 to node 707 to become the CLKOUT signal via correction path 808.0. Correction path 808.0 has no correction delay elements. Therefore, path 808.0 applies zero delay to signal path 101. When one of the CTL1–CTLN signals is activated, initial delay selector 806.0 allows the signal at node IN2 to pass through. The signal at node IN2 is the CLKIN signal after it propagates through certain number pass gates via one of the correction paths 808.1–808.N. For example, when the CTL2 signal is high, correction pass gates 806.2 allows the CLKIN signal on path 808.2 to enter. The CLKIN signal propagates through correction delay elements 802.2 and 802.1. Initial delay selector 806.0 allows the CLKIN from correction delay elements 802.2 to enter and passes to node 707 as the CLKOUT signal.

Figure 10:
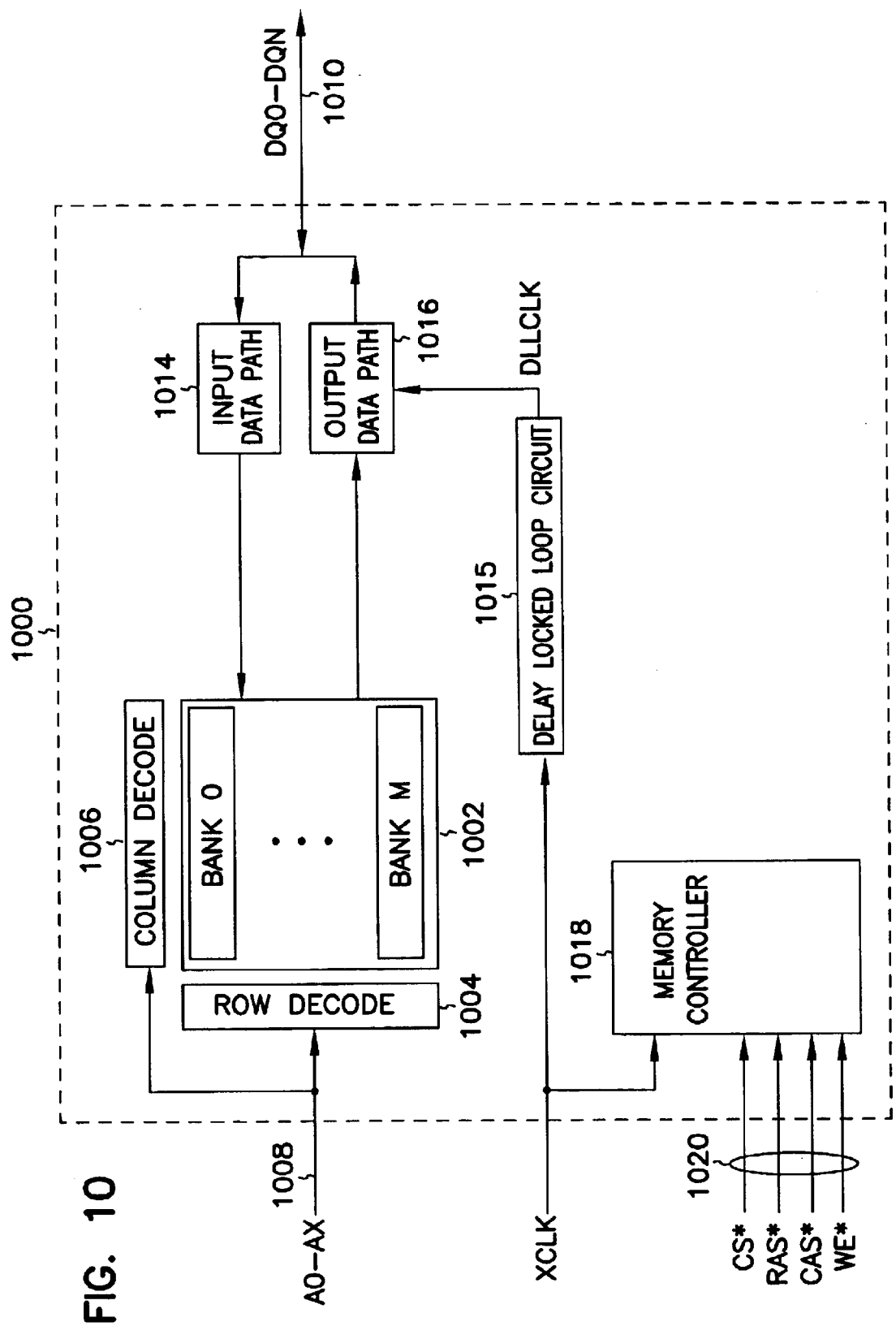
FIG. 10 shows a memory device according to an embodiment of the invention.

FIG. 10 shows memory device 1000 according to an embodiment of the invention. Memory device 1000 includes a main memory 1002 having a plurality of memory cells arranged in rows and columns. The memory cells are grouped into a plurality of memory banks indicated by bank 0 through bank M. Row decode 1004 and column decode 1006 access the memory cells in response to address signals A0 through AX (A0–AX) on address lines (or address bus) 1008. A data input path 1014 and a data output path 1016 transfer data between banks 0–M and data lines (or data bus) 1010. Data lines 1010 carry data signals DQ0 through DQN. A memory controller 1018 controls the modes of operations of memory device 1000 based on control signals on control lines 1020. The control signals include, but are not limited to, a Chip Select signal CS*, a Row Access Strobe signal RAS*, a Column Access Strobe CAS* signal, a Write Enable signal WE*, and an external signal XCLK.

Memory device 1000 further includes a DLL 1015 for receiving the XCLK signal to generate an internal signal DLLCLK The DLLCLK signal serves as a clock signal to control a transfer of data on data output path 1016. DLL 1015 has a quantifier for obtaining a measured delay quantity based on a time delay between the XCLK and DLLCLK signals. Based on the measured delay quantity, DLL 1015 applies a correction delay quantity to a signal path of the XCLK signal to synchronize the XCLK and DLLCLK signals. DLL 1015 includes embodiments of DLL 100 of FIG. 1.

In some embodiments, memory device 1000 is a dynamic random access memory (DRAM) device. In other embodiments, memory device 1000 is a static random access memory (SRAM), or flash memory. Examples of DRAM devices include synchronous DRAM commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAMs. Those skilled in the art recognize that memory device 1000 includes other elements, which are not shown for clarity.

FIG. 11 shows a system 1100 according to an embodiment of the invention. System 1100 includes a first integrated circuit (IC) 1102 and a second IC 1104. IC 1102 and IC 1104 can include processors, controllers, memory devices, application specific integrated circuits, and other types of integrated circuits. In FIG. 11, IC 1102 represents a processor and IC 1104 represents a memory device. Processor 1102 and memory device 1104 communicate using address signals on lines 1108, data signals on lines 1110, and control signals on lines 1120.

Memory device 1104 includes embodiments of memory device 1000 (FIG. 10) including DLL 1015, which corresponds to DLL 100 (FIG. 1).

System 1100 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A circuit comprising:
a pulse generator for generating a pulse corresponding to a time delay between an external signal and an internal signal;
a quantifier including a delay line connected to the pulse generator for quantifying the pulse to obtain a measured delay quantity;
a delay unit for applying a correction delay quantity to a correction path of the external signal; and
a delay controller connected to the delay unit and the quantifier, wherein the delay controller includes a control logic unit for selecting the correction delay equal to the measured delay quantity.

2. The circuit of claim 1 further includes a delay model connected to the delay unit for delaying an output signal from the delay unit to provide a feedback signal to the pulse generator.

3. The circuit of claim 1, wherein the pulse generator includes a plurality of edge creators for generating a first edge and a second edge of the pulse based on the time delay between the external signal and internal signal.

4. A circuit comprising:
a pulse generator for generating a pulse corresponding to a time delay between an external signal and an internal signal;
a quantifier connected to the pulse generator for quantifying the pulse to obtain a measured delay quantity;
a delay unit for applying a correction delay quantity to a correction path of the external signal; and
a delay controller connected to the delay unit and the quantifier for controlling the correction delay quantity based on the measured delay quantity, wherein the pulse generator includes a plurality of edge creators for generating a first edge and a second edge of the pulse based on the time delay between the external signal and internal signal, wherein the pulse generator further includes a reset unit for resetting the pulse generator to generate another pulse based on a reset signal.

5. A circuit comprising:
a pulse generator for generating a pulse corresponding to a time delay between an external signal and an internal signal;
a quantifier connected to the pulse generator for quantifying the pulse to obtain a measured delay quantity;
a delay unit for applying a correction delay quantity to a correction path of the external signal; and
a delay controller connected to the delay unit and the quantifier for controlling the correction delay quantity based on the measured delay quantity, wherein the quantifier includes:
a quantifying delay line for propagating the pulse; and
a quantifying logic unit connected to the quantifying delay line for comparing a plurality of delay quantities of the quantifying delay line with a width of the pulse to obtain the measured delay quantity.

6. A circuit comprising:
a pulse generator for generating a pulse corresponding to a time delay between an external signal and an internal signal;
a quantifier including a delay line connected to the pulse generator for quantifying the pulse to obtain a measured delay quantity;
a delay unit for applying a correction delay quantity to a correction path of the external signal; and
a delay controller connected to the delay unit and the quantifier for controlling the correction delay quantity based on the measured delay quantity, wherein the delay controller includes a control logic unit for selecting the correction delay equal to the measured delay quantity.

7. The circuit of claim 6, wherein the delay unit includes an initial delay selector for setting a delay of the correction path to zero before the pulse is generated.

8. A circuit comprising:
a forward path for receiving an external signal to produce an internal signal, the forward path including a delay unit for applying a correction delay quantity to a path of the external signal;
a feedback path for providing a feedback signal based on a delayed version of the external signal;
a pulse generator connected to the forward and feedback paths for generating a pulse based on the signal relationship between the feedback signal and an input signal derived from the external signal;
a quantifier connected to the pulse generator, wherein the quantifier includes:
a plurality of measuring delay elements for delaying the pulse to provide a plurality of delayed pulses; and
a plurality of quantifying logic gates connected to the measuring delay elements for comparing the pulse with each of the delayed pulses to determined a number of the measuring delay elements to obtain the measured delay quantity; and
a delay controller connected to the quantifier for controlling the correction delay quantity of the forward path based on the measured delay quantity.

9. The circuit of claim 8, wherein the pulse generator includes:
a first edge creator for producing one edge of the pulse based on an edge of one of the input and feedback signals; and
a second edge creator for producing another edge of the pulse based on an edge of the other one of the input and feedback signals.

10. The circuit of claim 8, wherein the delay line includes a plurality of different delay quantities, one of the delay quantities being equal to the correction delay.

11. The circuit of claim 8, wherein the forward path includes:
an input buffer to receive the external signal to generates the input signal; and
an output buffer to output the internal signal.

12. The circuit of claim 11, wherein the feedback path include a version of the input buffer connected in series with a version of the output buffer.

13. The circuit of claim 8, wherein the feedback path includes a delay model for delaying an output signal from the forward path to provide the feedback signal to the pulse generator.

14. A circuit comprising:
a forward path for receiving an external signal to produce an internal signal, the forward path including a delay unit for applying a correction delay quantity to a path of the external signal;
a feedback path for providing a feedback signal based on a delayed version of the external signal;
a pulse generator connected to the forward and feedback paths or generating a pulse based on the signal relationship between the feedback signal and an input signal derived from the external signal;
a quantifier connected to the pulse generator for quantifying the pulse to obtain a measured delay quantity; and
a delay controller connected to the quantifier for controlling the correction delay quantity of the forward path based on the measured delay quantity, wherein the pulse generator includes a reset unit for resetting the pulse generator to generate another pulse.

15. A circuit comprising:
a forward path for receiving an external signal to produce an internal signal, the forward path including a delay unit for applying a correction delay quantity to a path of the external signal;
a feedback path for providing a feedback signal based on a delayed version of the external signal;
a pulse generator connected to the forward and feedback paths or generating a pulse based on the signal relationship between the feedback signal and an input signal derived from the external signal;
a quantifier connected to the pulse generator for quantifying the pulse to obtain a measured delay quantity; and
a delay controller connected to the quantifier for controlling the correction delay quantity of the forward path based on the measured delay quantity, wherein the quantifier includes:
a plurality of measuring delay elements for delaying the pulse to provide a plurality of delayed pulses; and
a plurality of quantifying logic gates connected to the measuring delay elements for comparing the pulse with each of the delayed pulses to determined a number of the measuring delay elements corresponding to the measured delay quantity.

16. The circuit of claim 15, wherein the quantifier further includes a storing portion connected to the quantifying logic gates for storing the number of the measuring delay elements corresponding to the measured delay quantity.

17. A circuit comprising:
a forward path for receiving an external signal to produce an internal signal, the forward path including a delay unit for applying a correction delay quantity to a path of the external signal;
a feedback path for providing a feedback signal based on a delayed version of the external signal;
a pulse generator connected to the forward and feedback paths or generating a pulse based on the signal relationship between the feedback signal and an input signal derived from the external signal;
a quantifier including a delay line connected to the pulse generator for quantifying the pulse to obtain a measured delay quantity; and
a delay controller connected to the quantifier for controlling the correction delay quantity of the forward path based on the measured delay quantity, wherein the forward path includes an initial delay selector for selecting an initial correction delay quantity before the pulse is generated.

18. The circuit of claim 17, wherein the delay controller includes a delay control logic connected to the initial delay selector for setting the initial correction delay quantity to zero.

19. A circuit comprising:
a forward path for receiving an external signal to produce an internal signal;
a feedback path for providing a feedback signal based on a delayed version of the external signal;
a pulse generator connected to the forward and feedback paths for generating a pulse based on the signal relationship between the feedback signal and an input signal derived from the external signal;
a quantifier connected to the pulse generator for quantifying the pulse to obtain a measured delay quantity; and
a delay controller connected to the quantifier for controlling a correction delay quantity of the forward path based on the measured delay quantity, wherein the forward path further includes a correction selector for setting a correction delay after equaled to the measured delay quantity after the pulse is generated.

20. The circuit of claim 19, wherein the delay controller includes a delay control logic connected to the correction selector for setting the correction delay quantity equal to the measured delay quantity.

21. A circuit comprising:
a pulse generator for generating a pulse having a pulse width corresponding to a time delay between an external signal and an internal signal;
a plurality of measuring delay elements connected to the pulse generator for propagating the pulse through the measuring delay elements;
a quantifying logic unit connected to the measuring delay elements for determining a number of the measuring delay elements corresponding to the pulse width;
a plurality of correction delay elements located in a signal path of the external signal for applying a number of correction delay elements to the signal path; and
a control logic unit connected to the quantifying logic unit for adjusting the number of correction delay elements based on the number of the measuring delay elements to synchronize the external and internal signals.

22. The circuit of claim 21, wherein the pulse generator includes a first set of flip flop for generating a first edge of the pulse based on an edge of a first delayed version of the external signal.

23. The circuit of claim 22, wherein the pulse generator includes a second set of flip flops for generating a second edge of the pulse based on an edge of a second delayed version of the external signal.

24. The circuit of claim 21, wherein the quantifying logic unit includes a plurality of quantifying logic gates, each connecting to one of the measuring delay elements for comparing a delay of a number of the measuring delay elements with the pulse width.

25. The circuit of claim 24, wherein the quantifying logic unit further includes a plurality of storage devices, each connecting to one of the quantifying logic gates for storing a value corresponding to a number of measuring delay elements within the width of the pulse.

26. The circuit of claim 25, wherein the control logic unit includes a plurality of control logic gates connected to the storage devices for activating a delay control signal to select a correction of path among a plurality of correction of paths of the external signal.

27. The circuit of claim 26 further includes a plurality of correction pass gates, each being located in one of the correction of paths and being controlled by one the control logic gates.

28. The circuit of claim 21, wherein a total number of the of correction delay elements is equal to or greater than a total number of the measuring delay elements.

29. The circuit of claim 28, wherein each of the of measuring delay elements and each of the correction delay elements have equal time delay.

30. The circuit of claim 21 further includes a delay model connected to the correction delay elements for delaying an output signal from the delay unit to provide a feedback signal to the pulse generator.

31. An integrated circuit comprising:
   a plurality of cells for holding data;
   a path for transferring the data between the cells and data lines and
   a circuit for generating an internal signal based on an external signal to control a transfer of the data on the path, the circuit including:
      a pulse generator for generating a pulse corresponding a time delay between the external signal and the internal signal;
      a quantifier including a delay line connected to the pulse generator for quantifying the pulse to obtain a measured delay quantity;
      a delay unit capable of applying a correction delay quantity to a correction path of the external signal; and
      a delay controller connected to the delay unit and the quantifier for controlling the correction delay quantity based on the measured delay quantity, wherein the delay controller includes a control logic unit for selecting the correction delay equal to the measured delay quantity.

32. A system comprising:
   a processor; and
   a memory device connected to the processor via bus lines, the memory device including:
      a plurality of memory cells;
      a data path for transferring data between the memory cells the bus lines; and
      a circuit for generating an internal signal based on an external signal to control a transfer of the data on the data path, the circuit including:
         a forward path for receiving the external signal produce the internal signal, the forward path including a delay unit for applying a correction delay quantity to a path of the external signal;
         a feedback path for providing a feedback signal based on a delayed version of the external signal;
         a pulse generator connected to the forward and feedback paths for generating a pulse based on the signal relationship between the feedback signal and an input signal derived from the external signal;
         a quantifier including a delay line connected to he pulse generator for quantifying the pulse to obtain a measured delay quantity; and
         a delay controller connected to the quantifier for controlling the correction delay quantity of the forward path based on the measured delay quantity, wherein the delay controller includes a control logic unit for selecting the correction delay equal to the measured delay quantity.

33. A method of processing signals, the method comprising:
   generating a pulse corresponding to a time delay between an external signal and an internal signal;
   quantifying the pulse to obtain a measured delay quantity, wherein quantifying includes propagating the pulse through different measuring delay elements to produce different delay pulses, and comparing each of the different delay pulses with the pulse to obtain the measured delay quantity;
   applying a correction delay quantity to a correction path of the external signal; and
   controlling the correction delay quantity based on the measured delay quantity.

34. The method claim 33, wherein generating a pulse includes generating a first edge and a second edge of the pulse based on the time delay between the external signal and the internal signal.

35. The method of claim 34, wherein generating a pulse occurs while the correction delay quantity equals zero.

36. The method of claim 33, wherein applying a correction delay quantity includes applying a non-zero correction delay after the pulse is generated.

37. The method of claim 33, wherein applying a correction delay quantity includes applying the correction delay quantity equal to zero before the pulse is generated.

38. The method of claim 33, wherein applying a correction delay quantity includes applying a non-zero correction delay after the pulse is generated.

39. The method of claim 38, wherein controlling the correction delay quantity includes selecting a the correction delay quantity equal to the measured delay quantity after the pulse is generated.

40. A method of processing signals, the method comprising:
   generating an internal signal based on an external signal;
   producing a feedback signal based on a delayed version of the external signal;
   generating a pulse based on the signal relationship between the feedback signal and an input signal derived from the external signal;

quantifying the pulse to obtain a measured delay quantity, wherein quantifying includes delaying the pulse to provide a plurality of delayed pulses, and comparing the pulse with each of the delayed pulses to determined a number of measuring delay elements corresponding to the measured delay quantity; and controlling a correction delay quantity of the forward path based on the measured delay quantity.

41. The method of claim 40, wherein generating an internal signal includes applying a correction delay quantity to a correction path of the external.

42. The method of claim 41, wherein the initial delay quantity is zero before the pulse is generated.

43. The method of claim 40, wherein the correction delay quantity is greater than zero after the pulse is generated.

44. The method of claim 40, wherein a correction delay quantity includes setting the correction delay equal to the measured delay quantity.

45. The method of claim 40, wherein generating a pulse include:

producing one edge of the pulse based on an edge of one of the input and feedback signals; and producing another edge of the pulse based on an edge of the other one of the input and feedback signals.

46. The circuit of claim 45 further includes generating another pulse when a reset signal is activated.

47. The method of claim 40, wherein quantifying the pulse further includes storing the number of measuring delay elements corresponding to the measured delay quantity.

48. A method of processing signals, the method comprising:

applying an initial delay quantity to a correction path of an external signal to generate an internal signal;

generating a pulse with a pulse width corresponding to a time delay between the external and internal signals;

propagating the pulse through different measuring delay elements to produce different delay pulses;

comparing each of the different delay pulses with the pulse to obtain a measured delay quantity based on the pulse width; and applying a correction delay quantity to the correction path based on the measured delay quantity to synchronize the external and internal signals.

49. The method of claim 48, wherein the initial delay is zero before the pulse is generated.

50. The method of claim 48, wherein the correction delay quantity equals the measured delay quantity.

* * * * *

UNITED STATES PATENT AND TRADEMARK OFFICE
CERTIFICATE OF CORRECTION

PATENT NO. : 6,917,228 B2
DATED : July 12, 2005
INVENTOR(S) : Cooper

It is certified that error appears in the above-identified patent and that said Letters Patent is hereby corrected as shown below:

Title page,
Item [56], References Cited, U.S. PATENT DOCUMENTS,
"6,388,480" reference, after "Stubbs" delete "et al.".
"6,392,458" reference, after "Miller" delete "et al.".

Column 9,
Line 18, delete "include" and insert -- includes --, therefor.
Lines 33 and 52, delete "or" and insert -- for --, therefor.

Column 10,
Line 14, delete "or" and insert -- for --, therefor.

Column 11,
Line 28, after "one" insert -- of --.
Line 43, after "line" insert -- ; --.
Line 48, after "corresponding" insert -- to --.

Column 12,
Line 6, after "signal" insert -- to --.
Line 17, delete "he" and insert -- the --, therefor.
Line 57, after "selecting" delete "a".

Column 13,
Line 4, delete "determined" and insert -- determine --, therefor.
Line 20, delete "include:" and insert -- includes: --, therefor.

Signed and Sealed this

Sixth Day of December, 2005

JON W. DUDAS
*Director of the United States Patent and Trademark Office*